(12) United States Patent
Katayama et al.

(10) Patent No.: US 7,773,389 B2
(45) Date of Patent: Aug. 10, 2010

(54) ELECTRONIC COMPONENT MOUNTED STRUCTURE AND OPTICAL TRANSCEIVER USING THE SAME

(75) Inventors: Hiroki Katayama, Hitachi (JP); Yoshiaki Ishigami, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 332 days.

(21) Appl. No.: 11/080,672

(22) Filed: Mar. 16, 2005

(65) Prior Publication Data

US 2006/0018104 A1 Jan. 26, 2006

(30) Foreign Application Priority Data

Jul. 20, 2004  (JP)  ............... 2004-211803

(51) Int. Cl.
*H05K 7/00* (2006.01)
(52) U.S. Cl. ....................................... 361/782; 257/724
(58) Field of Classification Search ................. 361/782, 361/783; 257/724; 333/33
See application file for complete search history.

(56) References Cited

U.S. PATENT DOCUMENTS

| | | | | |
|---|---|---|---|---|
| 5,559,363 A | * | 9/1996 | Immorlica, Jr. ............. 257/664 |
| 5,592,391 A | * | 1/1997 | Muyshondt et al. ........... 716/15 |
| 6,100,773 A | * | 8/2000 | Nakamichi et al. ............ 333/32 |
| 6,310,780 B1 | * | 10/2001 | Tamura et al. ............... 361/761 |
| 2005/0140553 A1 | * | 6/2005 | Kuramoto .................... 343/702 |
| 2006/0018104 A1 | * | 1/2006 | Katayama et al. ............ 361/782 |
| 2006/0065432 A1 | * | 3/2006 | Kawauchi et al. ............ 174/254 |

FOREIGN PATENT DOCUMENTS

| | | |
|---|---|---|
| JP | 9-107210 A | 4/1997 |
| JP | 2000-174443 A | 6/2000 |
| JP | 2003-86927 A | 3/2003 |

* cited by examiner

*Primary Examiner*—Jinhee J Lee
*Assistant Examiner*—Abiy Getachew
(74) *Attorney, Agent, or Firm*—Foley & Lardner LLP

(57) ABSTRACT

An electronic component mounted structure has: a circuit board; two semiconductor elements that are mounted on the circuit board; and an AC coupling capacitor that is operable to cut off signals with a predetermined frequency or less and is provided between the two semiconductor elements. The AC coupling capacitor is mounted on the circuit board such that a part or a whole of the AC coupling capacitor is away from the surface of the circuit board.

8 Claims, 7 Drawing Sheets

$G \geqq g、W \geqq w$

ELECTRONIC COMPONENT MOUNTED STRUCTURE AND OPTICAL TRANSCEIVER USING THE SAME

The present application is based on Japanese patent application No. 2004-211803, the entire contents of which are incorporated herein by reference.

BACKGROUND OF THE INVENTION

1. Field of the Invention

The invention relates to an electronic component mounted structure comprising an AC coupling capacitor, which functions to cut off signals with a predetermined frequency or less, mounted between two semiconductor elements.

2. Description of the Related Art

A conventional electronic component mounted structure comprising a plurality of electronic components such as semiconductor elements mounted on a circuit board is shown as an electronic component mounted structure 161 in FIG. 1. In this electronic component mounted structure 161, a semiconductor laser (LD) module 163 for transmitting a light signal, a photodiode (PD) module 164 for receiving a light signal, and an LD driver (LDD) 165 for driving the LD module 163 are mainly mounted on a circuit board 162.

The transmission distance L between the LD module 163 and the LDD 165 is previously designed to be a predetermined length from the viewpoint of preventing reflection of signals between the LD module 163 and the LDD 165. The transmission distance L is preferably as short as possible although it is restricted by other electronic components mounted in the electronic component mounted structure 161.

To this end, an impedance matching line (microstrip line) 166 having a predetermined characteristic impedance is provided between the LD module 163 and the LDD 165 provided on the surface of the circuit board 162. An AC coupling capacitor 167 for cutting off signals with a predetermined frequency or less is mounted on the impedance matching line 166 between the LD module 163 and the LDD 165.

As shown in FIG. 2, the circuit board 162 is a multilayered board having a multilayer structure comprising an impedance matching line 166, an insulator layer 168, a ground (GND) layer 169 and the like stacked on top of one another.

The electronic component mounted structure of this type is disclosed in Japanese Patent Laid-Open No. 174443/2000.

In the electronic component mounted structure 161, however, since the circuit board 162 is a multilayered board, the distance t between individual layers (thickness of the insulator layer 168) is very short (for example, about 0.2 mm). Therefore, a parasitic capacitance C18 as shown in FIG. 3 is disadvantageously formed between the AC coupling capacitor 167 and the GND layer 169 located just beneath the AC coupling capacitor 167.

Upon the formation of parasitic capacitance C18, a high frequency component of a signal is run away through the parasitic capacitance C18 into the GND layer 169. As a result, Tr (rising)/Tf (falling) in the eye aperture (degree of opening of eyes in signal waveform) is so slow that the eye is disadvantageously closed (dull).

The eye aperture is one of measures for the evaluation of waveform quality in digital signal waveforms. When the eye aperture is large, signal discrimination is reliable and, thus, the frequency of transmission error is reduced. On the other hand, when the eye aperture is small, the signal discrimination is unreliable and, thus, the frequency of transmission error is increased. That is, closing of the eye deteriorates transmission characteristics.

Further, the electronic component mounted structure 161 has a problem that, for example, an error in mounting the LD module 163 onto the circuit board 162 makes it difficult to provide a transmission distance L as designed.

SUMMARY OF THE INVENTION

Accordingly, it is an object of the invention to provide an electronic component mounted structure with a reduced parasitic capacitance and good electric characteristics and transmission characteristics and an optical transceiver using the same.

It is another object of the invention to provide an electronic component mounted structure, in which the transmission distance between semiconductor elements can be regulated, and an optical transceiver using the same.

(1) According to one aspect of the invention, an electronic component mounted structure comprises:
  a circuit board;
  two semiconductor elements that are mounted on the circuit board; and
  an AC coupling capacitor that is operable to cut off signals with a predetermined frequency or less and is provided between the two semiconductor elements,
  wherein the AC coupling capacitor is mounted on the circuit board such that a part or a whole of the AC coupling capacitor is away from the surface of the circuit board.

It is preferred that the AC coupling capacitor is mounted through a mount member on the surface of the circuit board.

It is preferred that the mount member comprises a capacitor that has a capacitance lower than the AC coupling capacitor, or a resistor that has such a magnitude that allows a direct current to flow across the semiconductor elements to be approximately zero.

It is preferred that the mount member comprises a raised solder or an electrically conductive spacer.

It is preferred that the mount member comprises an inductance element that is connected to both ends of the AC coupling capacitor.

It is preferred that the AC coupling capacitor is connected in series with a capacitor or resistor in series to form an air bridge.

(2) According to another aspect of the invention, an electronic component mounted structure comprises:
  a circuit board;
  two semiconductor elements that are mounted on the circuit board; and
  an AC coupling capacitor that is operable to cut off signals with a predetermined frequency or less and is provided between the two semiconductor elements,
  wherein
  the circuit board comprises a ground layer or a power supply layer that is closest to the AC coupling capacitor, and
  the ground layer or the power supply layer comprises a void part located directly below the AC coupling capacitor.

(3) According to still another aspect of the invention, an electronic component mounted structure comprises:
  a circuit board;
  two semiconductor elements that are mounted on the circuit board; and
  an AC coupling capacitor that is operable to cut off signals with a predetermined frequency or less and is provided between the two semiconductor elements,
  wherein the circuit board comprises a hole that is located directly below the AC coupling capacitor and extends to a such depth that prevents a parasitic capacitance generated directly below the AC coupling capacitor.

(4) According to a further aspect of the invention, an optical transceiver comprises:

any one of the above electronic component mounted structures, wherein one of the two semiconductor elements is a semiconductor laser for transmitting a light signal, and the other of the two semiconductor elements is a driver for driving the semiconductor laser.

ADVANTAGES OF THE INVENTION

According to the invention, the following excellent effects can be attained.

(i) The parasitic capacitance can be reduced, and good electric characteristics and transmission characteristics can be realized.

(ii) The transmission distance between semiconductor elements can be regulated.

BRIEF DESCRIPTION OF THE DRAWINGS

The preferred embodiments according to the invention will be explained below referring to the drawings, wherein.

DESCRIPTION OF THE PREFERRED EMBODIMENTS

Figure 14A:
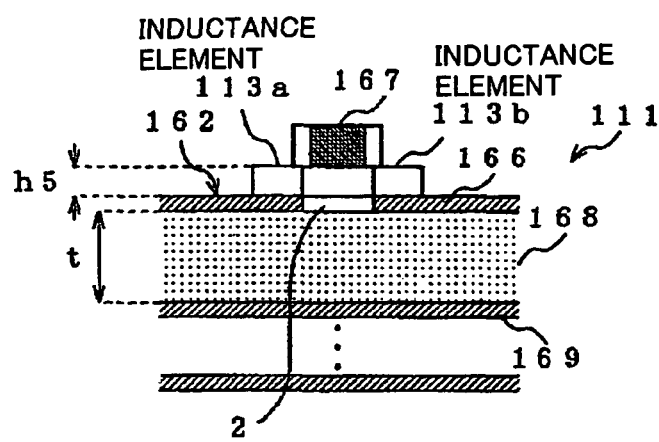
FIG. 14A is a longitudinal sectional view of a main part of an electronic component mounted structure shown in a fifth preferred embodiment of the invention.
Figure 14B:
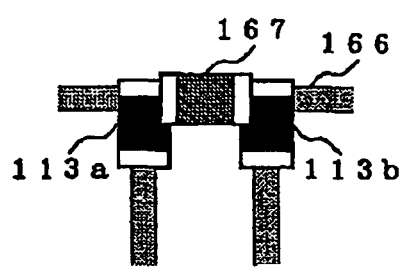
FIG. 14B is a top view of the electronic component mounted structure shown in the fifth preferred embodiment of the invention.
Figure 15:
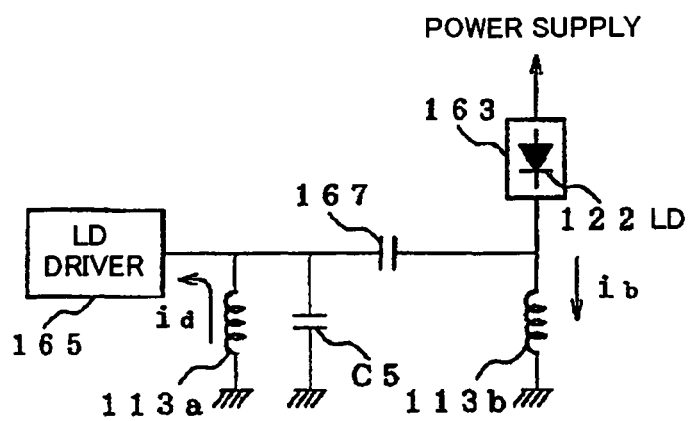
FIG. 15 is a diagram showing an equivalent circuit in the electronic component mounted structure shown in FIG. 14.
Figure 16:
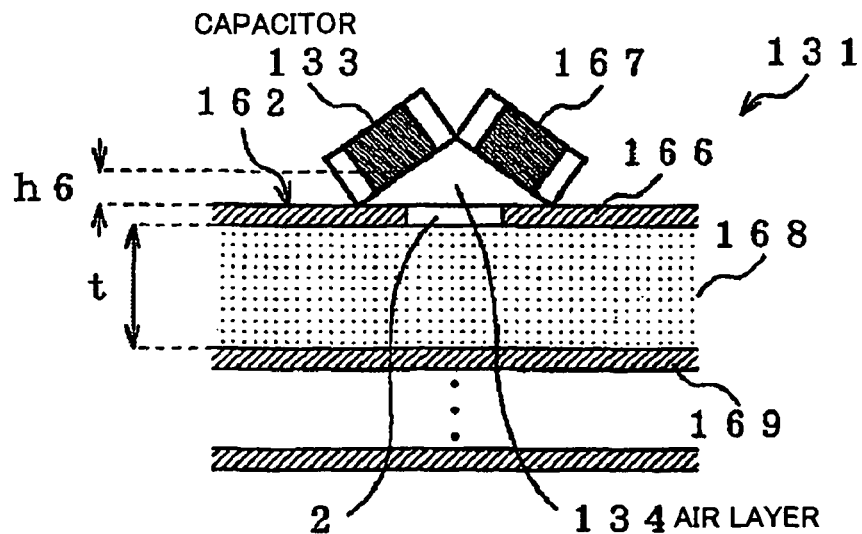
FIG. 16 is a longitudinal sectional view of a main part of an electronic component mounted structure in a sixth preferred embodiment of the invention.
Figure 17:
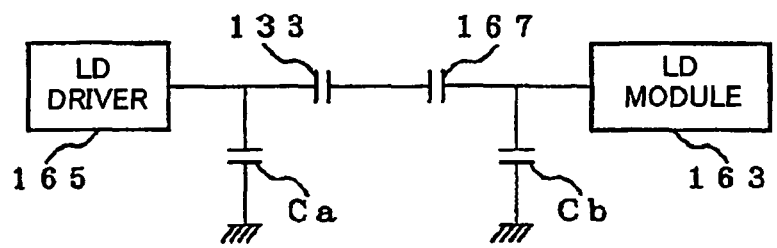
FIG. 17 is a diagram showing an equivalent circuit of the electronic component mounted structure shown in FIG. 16.
Figure 18:
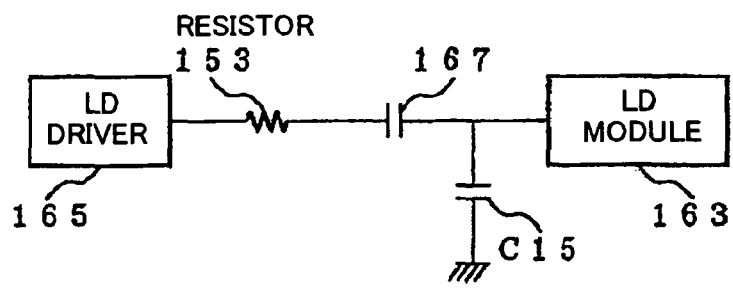
FIG. 18 is a diagram showing a variant of the equivalent circuit of a main part of the electronic component mounted structure shown in FIG. 16.

FIGS. 4 to 9 and FIGS. 14 to 18 show preferred embodiments of the AC coupling capacitor mounted structure. Specifically, FIGS. 4 to 9, FIG. 14 and FIG. 15 are preferred embodiments in which an AC coupling capacitor is mounted on a circuit board in such a state that the whole AC coupling capacitor is separated from the circuit board. FIGS. 16 to 18 are preferred embodiments in which an AC coupling capacitor is mounted on a circuit board in such a state that a part of the AC coupling capacitor is separated from the circuit board. FIGS. 10 to 13 are preferred embodiments of the electronic component mounted structure in which the structure of a circuit board per se is improved.

First Embodiment

Figure 4:
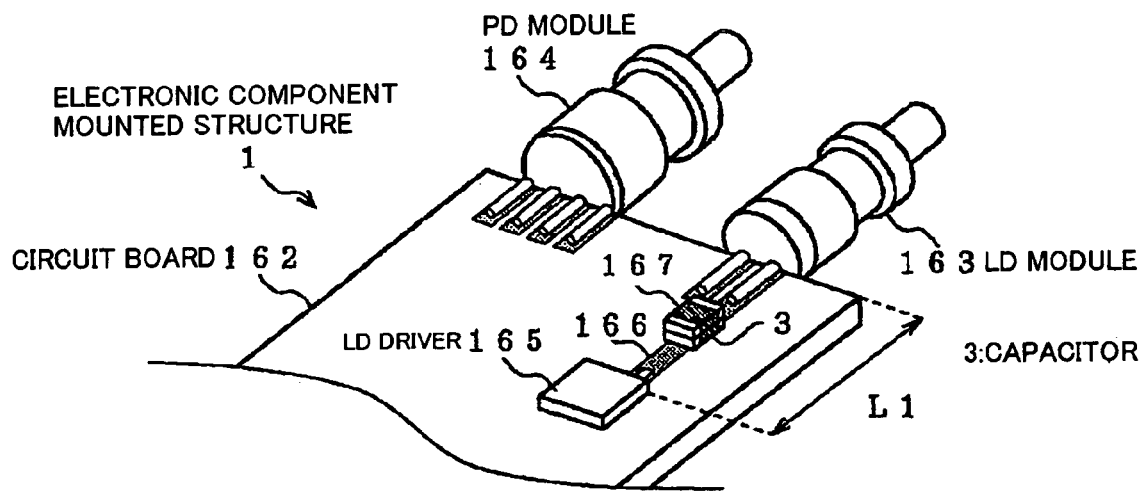
FIG. 4 is a perspective view of an electronic component mounted structure in a first preferred embodiment of the invention.
Figure 5:
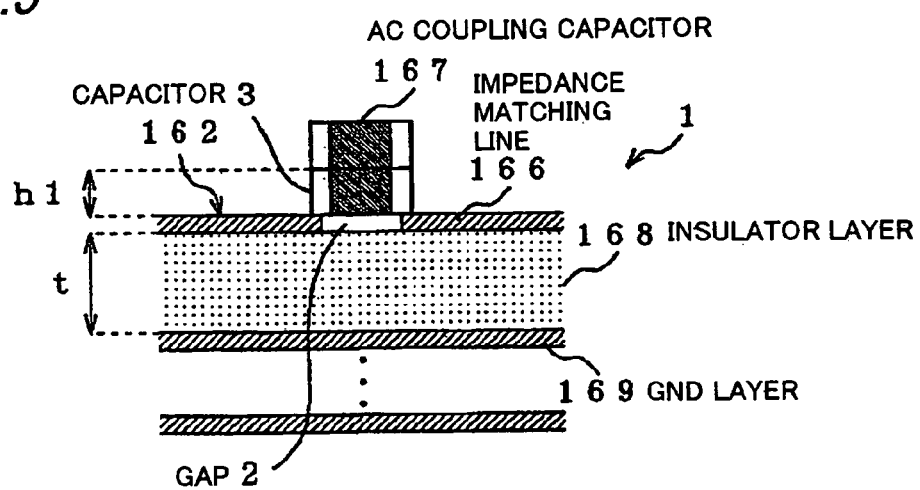
FIG. 5 is a longitudinal sectional view of a main part of the electronic component mounted structure shown in FIG. 4.

FIG. 4 is a perspective view of an electronic component mounted structure in a first preferred embodiment of the invention. FIG. 5 is a longitudinal sectional view of a main part of the electronic component mounted structure shown in FIG. 4.

As shown in FIGS. 4 and 5, the electronic component mounted structure 1 in the first preferred embodiment of the invention includes a circuit board 162. A semiconductor laser (LD) module 163 provided with LD as a semiconductor element for transmitting a light signal, a photodiode (PD) module 164 provided with PD as a semiconductor element for receiving a light signal, and an LD driver (LDD) 165 as a semiconductor element for driving the LD module 163 are mainly mounted on the circuit board 162.

An impedance matching line (microstrip line) 166 having a predetermined characteristic impedance (for example, 50Ω or 25Ω) formed of a copper (Cu) foil or the like is provided between the LD module 163 and the LDD 165 provided on the surface of the circuit board 162. A gap 2 as a measure for a mounting position of an AC coupling capacitor 167 for cutting off signals with a predetermined frequency or less is mounted on a halfway part in the impedance matching line 166 between the LD module 163 and the LDD 165.

A capacitor 3 having a significantly lower capacitance than the AC coupling capacitor 167 is provided, on the impedance matching line 166, as a mount member for mounting the AC coupling capacitor 167 on the circuit board 162 in such a state that the AC coupling capacitor 167 is separated from the circuit board 162. The AC coupling capacitor 167 is mounted so as to be superimposed on the surface of the capacitor 3. That is, the AC coupling capacitor 167 is mounted on the surface of the circuit board 162 through the capacitor 3.

At least one capacitor 3 is provided between the circuit board 162 and the AC coupling capacitor 167. The capacitance $C_k$ of the AC coupling capacitor 167 is determined depending upon a cut-off signal frequency f by the following equation:

$$f \propto 1/(RC_k)^{1/2}$$

wherein R represents impedance (25Ω or 50Ω)

For example, when a signal frequency ranging approximately from 100 kHz to 10 GHz is used, an AC coupling capacitor having a capacitance of about 0.1 μF is used as the AC coupling capacitor 167, and one capacitor having a capacitance of about 0.5 pF is used as the capacitor 3.

The AC coupling capacitor 167 and the capacitor 3 may be, for example, a thin sheet-like thin-film capacitor (a thin film-type chip coil) comprising an electrode of a metal such as Au (gold) or Cu (copper) provided on both ends of a thin sheet-like dielectric material.

The circuit board 162 is a multilayered board having a multilayer structure comprising an impedance matching line 166, an insulator layer 168, a ground (GND) layer 169 formed of a Cu foil or the like, a power supply layer (not shown) and the like stacked on top of one another (for example, the insulator layer 168 comprising 6 to 12 layers).

The GND layer 169 may be, for example, a GND solid layer which is entirely ground. Alternatively, the GND layer may be one comprising a stripe pattern. The layer-to-layer spacing (thickness of the insulator layer 168) t is, for example, about 0.2 mm. The characteristic impedance in the thickness-wise direction of each insulator layer 168 is set to a predetermined value (for example, 50Ω or 25Ω). For example, a glass epoxy laminate is used as the circuit board 162.

Here how to mount the AC coupling capacitor 167 will be explained. A solder coating region (pad) (not shown; see FIG. 11 which will be explained later) is formed near both ends of the gap 2. A capacitor 3 is soldered and fixed to these pads. An AC coupling capacitor 167 is superimposed on and connected and fixed onto the surface of the capacitor 3 with the aid of an electrically conductive adhesive or solder. Further, the capacitor 3 and the AC coupling capacitor 167 are covered by a resin to mount the AC coupling capacitor 167 on the circuit board 162.

The coefficient of thermal expansion of the capacitor 3 and that of the AC coupling capacitor 167 are substantially identical to each other and thus is not necessarily required to be covered by the resin. A method may also be adopted in which the AC coupling capacitor 167 is superimposed on and fixed to the surface of the capacitor 3 and the assembly is then mounted on the circuit board 162.

The electronic component mounted structure 1 having the above construction is housed, for example, in a two-piece casing (composed of upper and lower casings) formed of, for example, Cu, Cu alloy, CuW, Al (aluminum), and Fe (iron) having a high level of heat dissipation properties and is used as an optical transceiver.

The function of the first preferred embodiment will be explained.

In the electronic component mounted structure 1, the provision of the capacitor 3 between the circuit board 162 and the AC coupling capacitor 167 provides a mounted structure in which the whole AC coupling capacitor 167 is mounted on the circuit board 162 in such a state that the AC coupling capacitor 167 is separated from the surface of the impedance matching line 166 in the circuit board 162 by the height h1 of the capacitor 3.

The parasitic capacitance C is determined by the following equation:

$$C = \in S/d$$

wherein d represents the distance between polar plates (the distance between the backside of the AC coupling capacitor 167 and the surface of the GND layer 169); ∈ represents the permittivity of the medium provided between the polar plates; and S represents the area of the polar plate. As is apparent from the equation, the parasitic capacitance C decreases with increasing the distance d.

Figure 6:
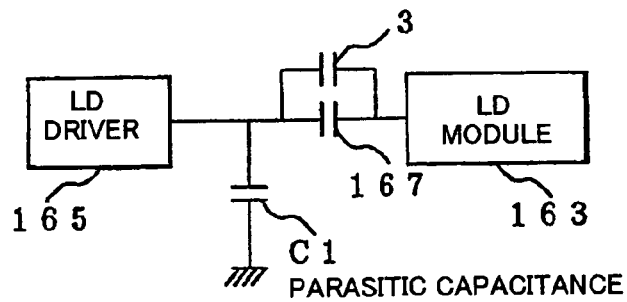
FIG. 6 is a diagram showing an equivalent circuit in the electronic component mounted structure shown in FIG. 5.

In the electronic component mounted structure 1 as well, as shown in an equivalent circuit shown in FIG. 6, a parasitic capacitance C1 is formed between the AC coupling capacitor 167 and the GND layer 169 provided just beneath the AC coupling capacitor 167. The parasitic capacitance C1 is, however, smaller than the parasitic capacitance C18 in FIG. 3, because, in the electronic component mounted structure 1, unlike the electronic component mounted structure 161 shown in FIG. 2, the whole AC coupling capacitor 167 is separated from the GND layer 169 located just beneath the AC coupling capacitor 167 by the height h1 of the capacitor 3. Therefore, the high frequency component of the signal is less likely to escape through the parasitic capacitance C1 into the GND layer 169, resulting in improved electric characteristics and transmission characteristics.

Further, in the electronic component mounted structure 1, using a capacitor 3 having a proper height h1 or properly varying the number of capacitors 3 enables the transmission distance L1 between the LD module 163 and the LDD 165 to be easily regulated by (2×height h1×number of pieces) even when an error or the like occurs in mounting the LD module 163 on the circuit board 162.

Accordingly, the electronic component mounted structure 1 is particularly usefully used, for example, as an optical transceiver which operates at a high transmission speed of not less than 1 Gbit/sec.

As shown in the equivalent circuit in FIG. 6, the capacitor 3 is connected parallel to the AC coupling capacitor 167. In this case, since the capacitance is significantly smaller than that of the AC coupling capacitor 167, the electric characteristics and transmission characteristics of the AC coupling capacitor 167 per se are not deteriorated.

Figure 7:
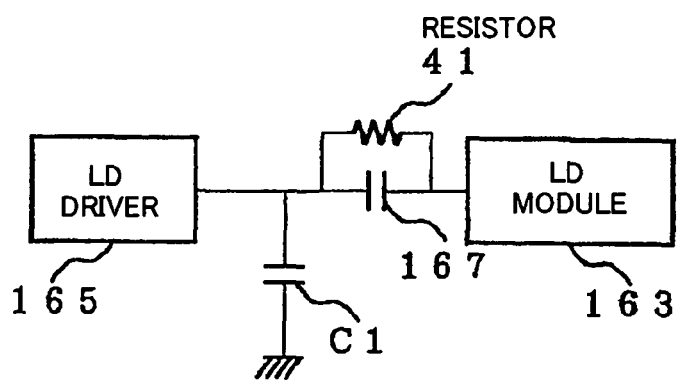
FIG. 7 is an equivalent circuit of a variant of a major part of the electronic component mounted structure shown in FIG. 4.

The capacitance of the capacitor 3 may be ideally zero (0) F. Therefore, regarding the mount member, as shown in FIG. 7, a resistor 41 having a resistance value which brings direct current, which flows across the LD module 163 and the LDD 165, to substantially zero (0), that is, a resistance value which limits the direct current level to a level (not more than 1 μA in this preferred embodiment) which is negligible as compared with the alternating current level, may be used instead of the capacitor 3.

The resistor 41 may be, for example, a ceramic plate, or a thin sheet-like thin-film resistor comprising an electrode of a metal such as Au or Cu provided on both ends of a thin sheet-like resistor member (a thin-film chip resistor). The resistance value of the resistor 41 may be, for example, not less than 1 MΩ.

In this case, since the coefficient of thermal expansion of the resistor 41 and that of the AC coupling capacitor 167 are different from each other, from the viewpoint of improving the reliability of the product, a method is preferably adopted in which the resistor 41 and the AC coupling capacitor 167 are mounted on the circuit board 162 in such a state that they are covered by a resin. Also in this case, since the AC coupling capacitor 167 is separated from the circuit board 162, the same function and effect as described above can be attained.

Second Embodiment

Figure 8:
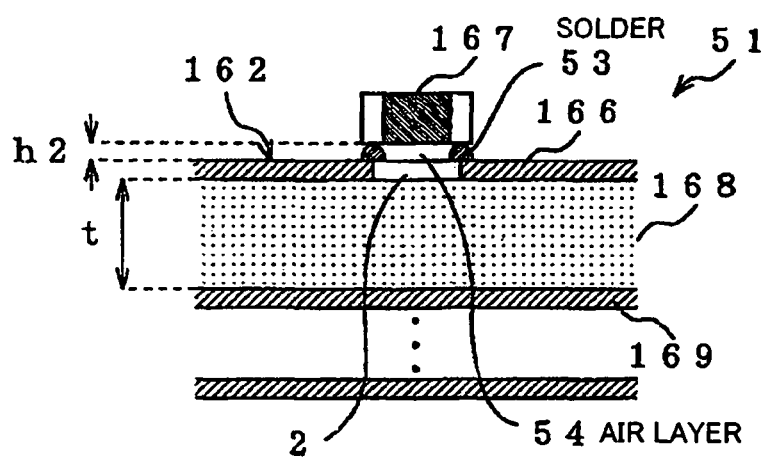
FIG. 8 is a longitudinal sectional view of a main part in a second preferred embodiment of the invention.
Figure 9A:
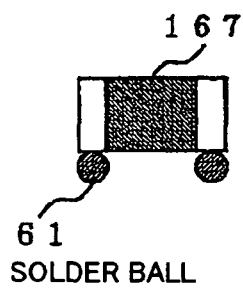
FIG. 9A is a longitudinal sectional view using solder balls as a mount member in the electronic component mounted structure shown in FIG. 8.
Figure 9B:
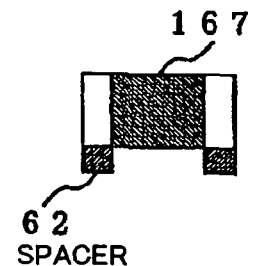
FIG. 9B is a longitudinal sectional view of a variant of the structure shown in FIG. 9A.

The second preferred embodiment of the invention will be explained in conjunction with FIG. 8 and FIGS. 9A and 9B. In FIG. 8 and FIGS. 9A, 9B, like components are indicated by the same numerals as used in FIGS. 4 and 5.

An electronic component mounted structure 51 in the second preferred embodiment is shown in FIG. 8. The construction of the electronic component mounted structure 51 in the second preferred embodiment is the same as that of the electronic component mounted structure 1 shown in FIG. 5, except that solder 53 raised from the surface of the impedance matching line 166 is used as the mount member and an air layer 54 is defined by the surface of the circuit board 162, the backside of the AC coupling capacitor 167, and the raised solder 53.

In forming the raised solder 53, for example, as shown in FIG. 9A, a plurality of solder balls (bumps) 61 (for example, 4 balls) used in BGA (ball grid array) may previously be provided on the backside of electrodes provided on both ends of the AC coupling capacitor 167. The AC coupling capacitor 167 with the solder balls 61 may be soldered to the circuit board 162 to form the raised solder 53 and the air layer 54.

Figure 1:
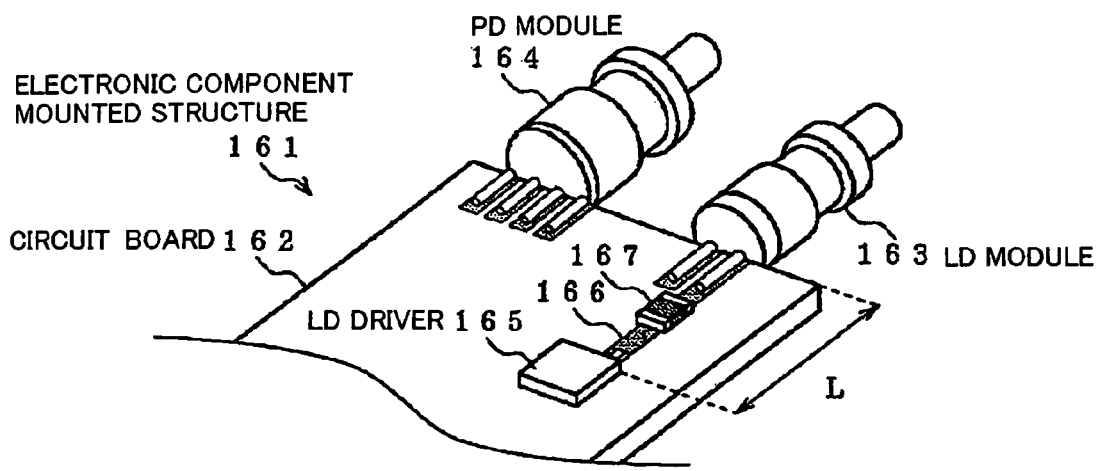
FIG. 1 is a perspective view of a conventional electronic component mounted structure.
Figure 2:
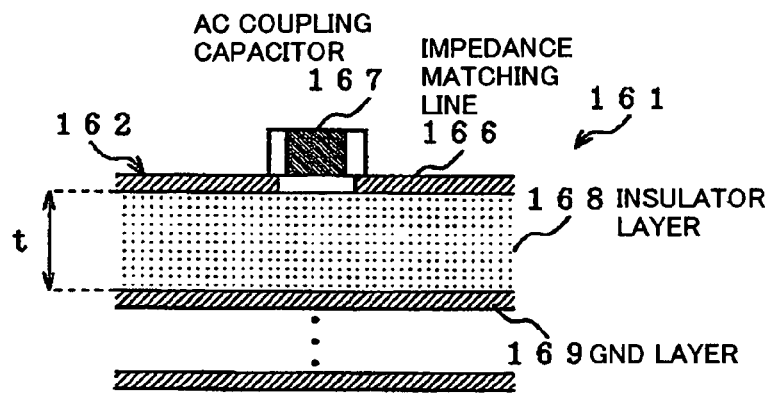
FIG. 2 is a longitudinal sectional view of a main part of the electronic component mounted structure shown in FIG. 1.

Also in this electronic component mounted structure 51, unlike the electronic component mounted structure 161 shown in FIG. 2, the whole AC coupling capacitor 167 is separated from the circuit board 162 by the height h2 of the solder 53 (air layer 54) raised from the GND layer 169 located just beneath the AC coupling capacitor 167. Therefore, the same function and effect as in the electronic component mounted structure 1 shown in FIGS. 4 and 5 can be attained.

Regarding the mount member, as shown in FIG. 9B, instead of the solder balls 61 shown in FIG. 9A, an electrically conductive spacer 62 formed of Cu or the like may previously be provided on the backside of electrodes provided on both ends of the AC coupling capacitor 167. It is a matter of course that the spacer 62 may previously be provided on the circuit board 162 side.

Third Embodiment

Figure 10:
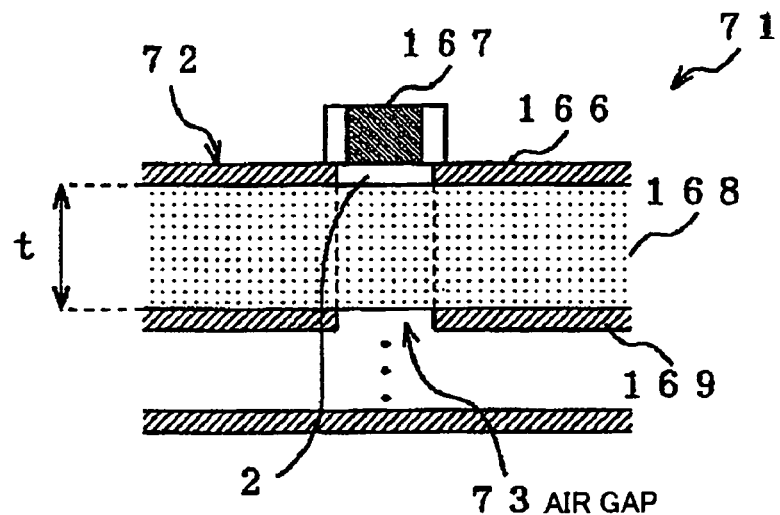
FIG. 10 is a longitudinal sectional view of a main part of an electronic component mounted structure in a third preferred embodiment of the invention.
Figure 11:
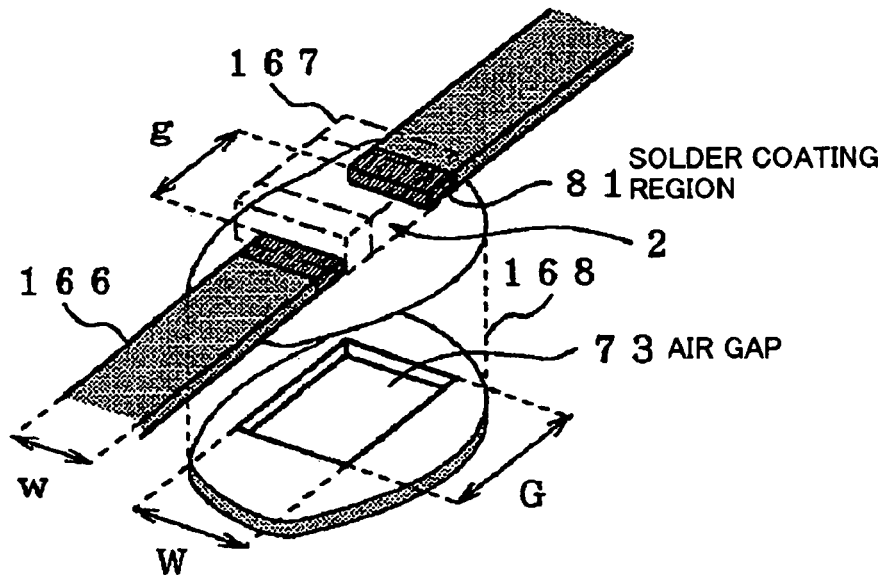
FIG. 11 is a perspective view of a main part of the electronic component mounted structure shown in FIG. 10.

The third preferred embodiment in which the structure of the circuit board per se is improved will be explained in conjunction with FIGS. 10 and 11. In FIGS. 10 and 11, like components are indicated by the same numerals as used in FIGS. 4 and 5.

FIGS. 10 and 11 show an electronic component mounted structure 71 in the third preferred embodiment of the invention. The construction of the electronic component mounted structure 71 in the third preferred embodiment of the invention is the same as that of the electronic component mounted structure shown in FIGS. 4 and 5, except that a circuit board 72 is used instead of the circuit board 162. The construction of the circuit board 72 is basically the same as that of the circuit board 162, except that an air gap (a region free from the GND layer 169) 73 is provided in the GND layer 169 located just beneath the AC coupling capacitor 167.

A gap 2 as a measure for the position of mounting of the AC coupling capacitor 167 is provided in a halfway part of the impedance matching line 166, and the solder coating region (pad) 81 is provided at a position close to both ends of the gap 2.

The parasitic capacitance decreases with increasing the dimension of the air gap 73. The air gap 73 is preferably provided so as to have a dimension satisfying a requirement of $G \geq g$ and $W \geq w$ wherein G represents the length of the air gap 73, W represents the width of the air gap 73, g represents the length of the gap 2 of the impedance matching line 166 and w represents the width of the gap 2 of the impedance matching line 166. In this preferred embodiment, the air gap 73 is substantially the same as the bottom area of the AC coupling capacitor 167.

In the electronic component mounted structure 71, by virtue of the provision of the air gap 73, any parasitic capacitance is not formed between the AC coupling capacitor 167 and the GND layer 169 located just beneath the AC coupling capacitor 167. Therefore, the high frequency component of the signal does not escape into the GND layer 169, and, thus, the electric characteristics and transmission characteristics can be improved.

Only one air gap 73 may be provided as the air gap. The air gap may be provided in at least the GND layer (GND layer 169 in FIGS. 10 and 11) or power supply layer closest to the AC coupling capacitor 167 among the GND layers or power supply layers constituting the circuit board 72 just beneath the AC coupling capacitor 167.

Fourth Embodiment

Figure 12:
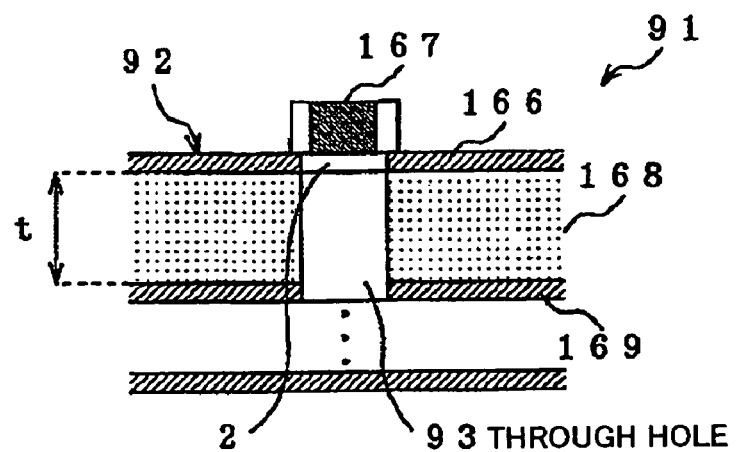
FIG. 12 is a longitudinal sectional view of a main part of an electronic component mounted structure in a fourth preferred embodiment of the invention.

The fourth preferred embodiment in which the structure of the circuit board per se is improved will be explained in conjunction with FIGS. 12 and 13. In FIGS. 12 and 13, like components are indicated by the same numerals as used in FIGS. 4 and 5.

FIGS. 12 and 13 show an electronic component mounted structure 91 in the fourth preferred embodiment of the invention. The construction of the electronic component mounted structure 91 in the fourth preferred embodiment of the invention is the same as that of the electronic component mounted structure shown in FIGS. 4 and 5, except that a circuit board 92 is used instead of the circuit board 162. The construction of the circuit board 92 is basically the same as that of the circuit board 162, except that, in a position corresponding to the gap 2 in the impedance matching line 166 as a measure for the position of mounting of the AC coupling capacitor 167, a through hole 93 which extends from the surface of the circuit board 92 to the backside of the GND layer 169 located just beneath the AC coupling capacitor 167 is provided.

Figure 13A:
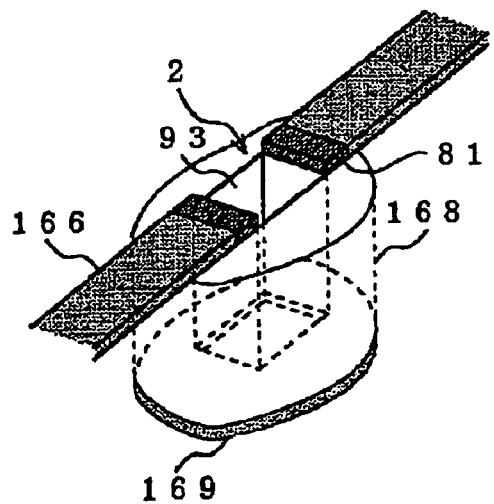
FIG. 13A is a perspective view of a main part of the electronic component mounted structure shown in FIG. 12.
Figure 13B:
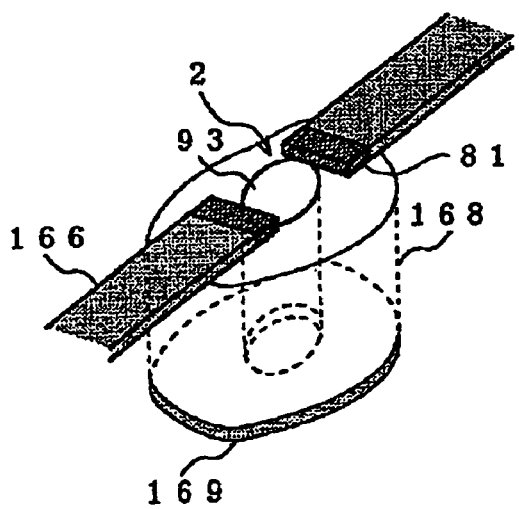
FIG. 13B is a perspective view of a variant of a main part of the electronic component mounted structure shown in FIG. 12.

The form of the through hole 93 is not limited to a polygon such as a quadrangle in section of plane vision as shown in FIG. 13A and may be a circle or ellipse in section of plane vision as shown in FIG. 13B.

In the electronic component mounted structure 91, by virtue of the provision of the through hole 93, any parasitic capacitance is not formed between the AC coupling capacitor 167 and the GND layer 169 located just beneath the AC coupling capacitor 167. Therefore, the high frequency component of the signal does not escape into the GND layer 169, and, thus, the electric characteristics and transmission characteristics can be improved.

The through hole is not limited to the through hole 93, which extends from the surface of the circuit board 92 to a halfway part of the circuit board 92, and may extend from the surface of the circuit board 92 to the backside of the circuit board 92.

Fifth Embodiment

The fifth preferred embodiment of the invention will be explained in conjunction with FIGS. 14A, 14B and 15. In FIGS. 14A, 14B and 15, like components are indicated by the same numerals as used in FIGS. 4 and 5.

FIGS. 14A, 14B and 15 show an electronic component mounted structure 111 in the fifth preferred embodiment of the invention. The electronic component mounted structure 111 in this preferred embodiment has the same construction as the electronic component mounted structure 1 shown in FIGS. 4 and 5, except that two inductance elements (ferrite beads in this preferred embodiment) 113a, 113b, which are connected parallel to respective both ends of the AC coupling capacitor 167, are used as the mount member. The AC coupling capacitor 167 and the inductance elements 113a, 113b are fixed to and mounted on the circuit board 162 with the aid of solder or an electrically conductive adhesive in such a state that they are covered by a resin.

Also in the electronic component mounted structure 111, as shown in an equivalent circuit shown in FIG. 15, a parasitic capacitance C5 is formed between the AC coupling capacitor 167 and the GND layer 169 provided just beneath the AC coupling capacitor 167. The parasitic capacitance C5 is, however, smaller than the parasitic capacitance C18 in FIG. 3, because, in the electronic component mounted structure 111, unlike the electronic component mounted structure 161 shown in FIG. 2, the whole AC coupling capacitor 167 is separated from the GND layer 169 located just beneath the AC coupling capacitor 167 by the height h5 of the inductance elements 113a, 113b. Therefore, the same function and effect as in the electronic component mounted structure 1 shown in FIGS. 4 and 5, can be attained.

Further, as shown in an equivalent circuit in FIG. 15, a direct current id for driving the LD driver 165 flows into the inductance element 113a, while a direct current ib for bias of LD 122 provided in the LD module 163 flows from LD 122 into the other inductance element 113b. An alternating current flows from LD 122 toward LDD 165.

That is, the electronic component mounted structure 111 is such that an AC cut coil which is hitherto provided separately from the AC coupling capacitor 167 is used as the mount member for the AC coupling capacitor 167. Therefore, the inductance elements 113a, 113b have both the function of cutting AC and the function of reducing the parasitic capacitance.

Sixth Embodiment

The sixth preferred embodiment of the invention will be explained in conjunction with FIGS. 16 to 18. In FIGS. 16 to 18, like components are indicated by the same numerals as used in FIGS. 4 and 5.

FIG. 16 shows an electronic component mounted structure 131 in conjunction with the sixth preferred embodiment of the invention. The electronic component mounted structure 131 has the same construction as the electronic component mounted structure 1 shown in FIGS. 4 and 5, except that an AC coupling capacitor 167 and other capacitor 133 are connected in series, and an air bridge is formed so as to provide an air layer 134 defined by the backside of the capacitors 167, 133 and the surface of the circuit board 162.

The capacitance of the capacitor 133 is preferably substantially identical to or larger than that of the AC coupling capacitor 167. However, for design reasons, the capacitance of the capacitor 133 may be smaller than that of the AC coupling capacitor 167.

Also in the electronic component mounted structure 131, as shown in an equivalent circuit in FIG. 17, parasitic capacitances Ca, Cb are formed respectively between the AC coupling capacitor 167 and the DND layer 169 located just beneath the AC coupling capacitor 167 and between the capacitor 133 and the DND layer 169 located just beneath the AC coupling capacitor 167.

Figure 3:
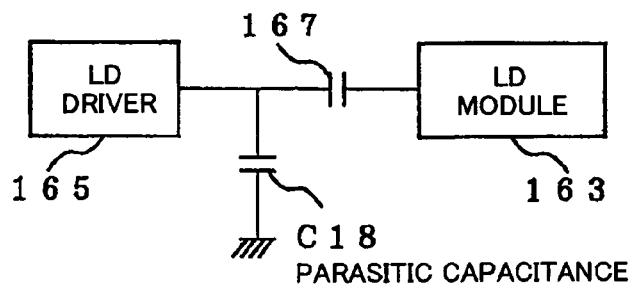
FIG. 3 is a diagram showing an equivalent circuit in the electronic component mounted structure shown in FIG. 2.

In the electronic component mounted structure 131, however, unlike the electronic component mounted structure 161 shown in FIG. 2, since a part of the AC coupling capacitor 167 (a part not in contact with the impedance matching line 166) is separated from the GND layer 169 located just beneath the AC coupling capacitor 167 by the average height h6 of the air layer 134, the parasitic capacitances Ca, Cb are smaller than the parasitic capacitance C18 in FIG. 3, and the same function and effect as in the electronic component mounted structure 1 in FIGS. 4 and 5 can be attained.

The capacitor 133 is connected in series to the AC coupling capacitor 167. In this case, when the capacitance of the capacitor 133 is significantly larger than that of the AC coupling capacitor 167, the electric characteristics and transmission characteristics of the AC coupling capacitor 167 per se are not deteriorated.

As shown in an equivalent circuit in FIG. 18, a resistor 153 (preferably having a resistance value of zero (0)) may be used instead of the capacitor 133. Also in this case, a parasitic capacitance C15 is formed. However, for the same reason as described above, the same function and effect can be attained.

In the above preferred embodiments, an AC coupling capacitor 167 is provided between an LD module 163 and an LDD 165. Each of the electronic component mounted structures explained in conjunction with FIGS. 4 to 18 can be applied even when an AC coupling capacitor is provided between a PD module and a preamplifier IC. Further, it should be noted that the invention is effective in all electronic component mounted structures in which an AC coupling capacitor is mounted between two semiconductor elements.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An electronic component mounted structure comprising:
a circuit board comprising a ground layer; two semiconductor elements that are mounted on the circuit board;
an impedance matching line provided on a surface of the circuit board provided between the two semiconductor elements;
an AC coupling capacitor connected to the impedance matching line and configured to cut off signals with a predetermined frequency or less and provided between the two semiconductor elements,
a first gap defined by a lower surface of the AC coupling capacitor and side surfaces of the impedance matching line; wherein the first gap is located directly below the AC coupling capacitor and a second gap provided at an area corresponding to the AC coupling capacitor in the ground layer, wherein the second gap is located directly below the first gap.

2. An optical transceiver comprising the electronic component mounted structure according to claim 1,
wherein one of the two semiconductor elements is a semiconductor laser for transmitting a light signal, and
the other of the two semiconductor elements is a driver for driving the semiconductor laser.

3. An optical transceiver comprising the electronic component mounted structure according to claim 1,
wherein an area of the second gap is not less than an area of the first gap.

4. An electronic component mounted structure comprising:
a circuit board; two semiconductor elements that are mounted on the circuit board; an impedance matching line provided on a surface of the circuit board provided between the two semiconductor elements; and an AC coupling capacitor connected to the impedance matching line and configured to cut off signals with a predetermined frequency or less and provided between the two semiconductor elements, wherein the circuit board comprises a hole that is located directly below the AC coupling capacitor and extends from the surface of the circuit board to a ground layer through an insulator layer of the circuit board, wherein the hole extends through the ground layer and through the impedance matching line.

5. An optical transceiver comprising the electronic component mounted structure according to claim 1,
    wherein one of the two semiconductor elements is a semiconductor laser for transmitting a light signal, and
    the other of the two semiconductor elements is a driver for driving the semiconductor laser.

6. An optical transceiver comprising the electronic component mounted structure according to claim 4.

7. An optical transceiver comprising the electronic component mounted structure according to claim 4,
    wherein the hole extends through the impedance matching line.

8. The electronic component mounted structure according to claim 4, wherein a lower surface of the AC coupling capacitor is exposed to the hole.

* * * * *